United States Patent [19]

Isayama et al.

[11] 4,271,366

[45] Jun. 2, 1981

[54] ANALOG SIGNAL DELAY CIRCUIT

[75] Inventors: Takuro Isayama, Tokyo; Takeshi Takemoto; Tsutomu Sato, both of Yokohama; Takao Fukazawa, Tokyo, all of Japan

[73] Assignee: Ricoh Co., Ltd., Tokyo, Japan

[21] Appl. No.: 4,484

[22] Filed: Jan. 18, 1979

[30] Foreign Application Priority Data

Jan. 18, 1978 [JP] Japan .................................. 53-3839

[51] Int. Cl.³ ..................... H03K 5/159; H03K 17/16; H03K 17/687
[52] U.S. Cl. .............................. 307/591; 307/221 D; 307/562; 307/564
[58] Field of Search ............... 307/221 C, 221 D, 293, 307/237

[56] References Cited

U.S. PATENT DOCUMENTS

| | | | |
|---|---|---|---|
| 3,621,402 | 11/1971 | Gardner | 307/221 C |
| 4,121,461 | 10/1978 | Butler et al. | 307/310 X |
| 4,136,287 | 1/1979 | Kephart | 307/221 D |
| 4,138,666 | 2/1979 | Eichelberger et al. | 307/221 D |
| 4,156,152 | 5/1979 | Butler | 307/221 D |

*Primary Examiner*—John S. Heyman
*Attorney, Agent, or Firm*—Burgess, Ryan and Wayne

[57] ABSTRACT

An analog delay circuit wherein an analog signal to be delayed as well as a reference voltage signal the voltage level of which is previously known are applied to an analog delay element comprising BBD, CCD or the like, and the reference signal is derived from the output of the analog delay element so that the reference signal or a signal associated therewith may be used for controlling a voltage to be applied to the analog element so as to set a bias voltage thereof.

3 Claims, 7 Drawing Figures

ANALOG SIGNAL DELAY CIRCUIT

BACKGROUND OF THE INVENTION

The present invention relates to a delay circuit incorporating an analog delay element such as a Bucket Brigate Device (BBD), Charge Coupled Device (CCD) or the like.

BBD, CCD and the like have been widely used in the prior art analog signal delay circuits. However, in the case of processing the analog signals widely ranging from the DC signals to the high frequency signals, the change in circuit characteristics inevitably results due to the temperature deviations and other causes. In order to compensate the variations in level for the temperature variations, the temperature-sensitive resistor elements such as thermistors, posistors, diodes and the like have been used, but they have been found incapable of providing sufficient temperature compensations. Furthermore, the adjustments of these temperature-sensitive resistor elements for attaining a desired level of temperature compensation are extremely difficult.

SUMMARY OF THE INVENTION

Accordingly, one of the objects of the present invention is to provide an analog delay circuit capable of effectively compensating the variations in DC level in the delay circuits comprising BBD, CCD or the like.

Another object of the present invention is to provide an analog delay circuit of the type which avoids the indirect compensation for temperature drifts of a delay circuit with the use of a temperature-sensitive resistor element, but directly detects the temperature drifts with a reference voltage signal, thereby controlling a bias setting voltage to be applied to the analog delay element.

A further object of the present invention is to provide an analog delay circuit wherein a reference voltage level signal is added to an analog signal to be applied to a delay circuit so as to provide a composite signal to be applied to a delay circuit and the difference between the analog signal and the reference voltage level signal is obtained from the composite signal which has passed through the delay circuit so as to compensate for the variations in level due to the variations in characteristics of the delay circuit.

PRIOR ART, FIG. 1

Figure 1:
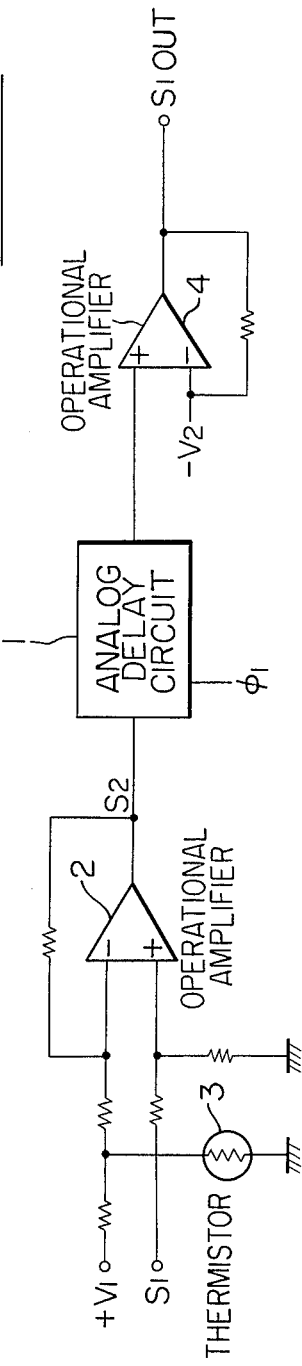
FIG. 1 is a diagram of the prior art temperature drift compensation circuit used in an analog delay circuit.

Referring first to FIG. 1, an example of the prior art analog signal delay circuits will be described. The input of an analog delay element 1 comprising BBD, CCD or the like is connected to the output of an operational amplifier 2. An analog delay element bias setting voltage $+V_1$ is applied to a thermistor 3, which is a temperature compensation element, and to the minus input of the operational amplifier while a signal $S_1$ such as a video signal to be delayed is applied to the plus input thereof. As a result, the bias setting voltage $+V_1$ and the signal $S_1$ to be delayed are superimposed upon each other to provide a signal $S_2$ which is applied to the analog delay element 1. The signal $S_2$ is delayed by a predetermined length of time by the analog delay element 1 and appears at the output thereof. The output signal from the analog delay element 1 is applied to the plus input terminal of an operational amplifier 4 to the minus input of which is applied a bias voltage $-V_2$ so as to subtract the bias setting voltage $+V_1$ from the superimposed signal $S_2$, thereby deriving only the video signal. Thus, the operational amplifier 4 delivers the video signal $S_1$ which is delayed b $\Delta t$.

In this analog delay circuit, the thermistor 3, which is connected to the minus input of the operational amplifier, serves to cause the bias setting voltage $+V$ to change with temperature change so that the temperature drift of the analog delay element 1 may be avoided.

However, in practice, the temperature characteristics of the analog delay element and the temperature-sensitive resistor element do not cecessarily coincide with each other so that it is next to impossible to attain the over-all adjustments of the circuit. Even when the over-all adjustments of the circuit could be accomplished, the aging problems would result because the analog delay element and the temperature-sensitive resistor element are in general not permitted to operate in the same temperature environment.

DETAILED DESCRIPTION OF THE INVENTION

Figure 2:
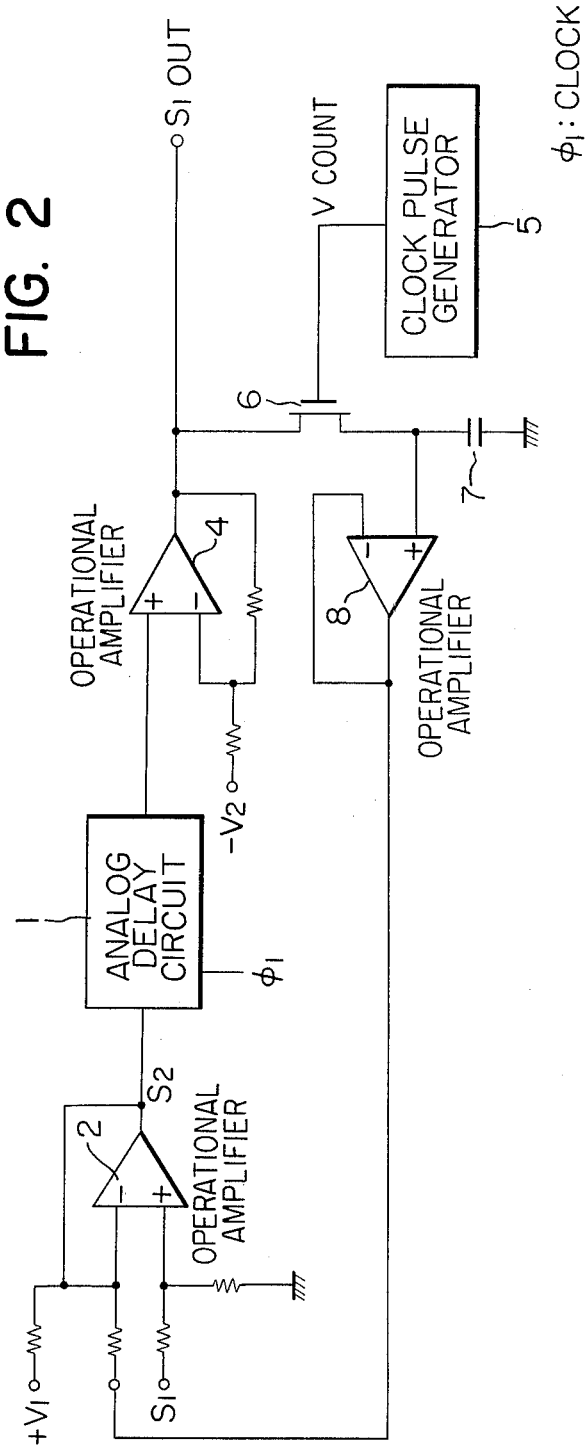
FIG. 2 is a diagram of an analog delay circuit incorporating a temperature drift compensation in accordance with the present invention.
Figure 3:
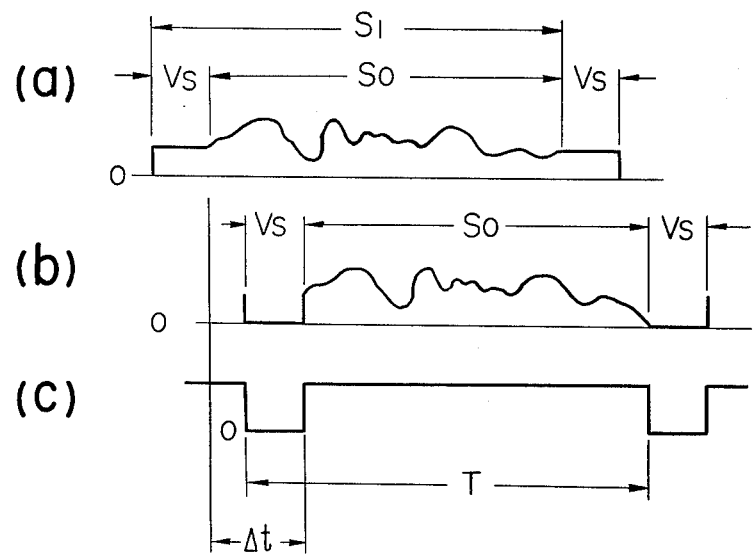
FIG. 3 shows waveforms used for the explanation of the circuit shown in FIG. 2.

First Embodiment, FIGS. 2 and 3

FIG. 2 is the circuit diagram of an analog delay circuit in accordance with the present invention. The input of the analog delay element 1 comprising BBD, CCD or the like is connected to the output of the first operational amplifier 2. An analog delay element bias setting voltage $+V_1$ is applied to the minus input of the first operational amplifier 2 which the plus input thereof receives a signal $S_1$ which is obtained by adding to a video signal $S_0$, a reference signal $V_s$, whose voltage is known, during a blanking pulse or at an interval between the adjacent frames. The signal $S_1$ and the bias setting voltage $+V_1$ are superimposed upon each other and applied as a signal $S_2$ to the analog delay element 1. After a predetermined length of time $\Delta t$, the analog delay element 1 delivers the signal $S_2$ at its output and applies it to the plus input of the second operational amplifier 4. Applied to the minus input thereof is a bias voltage $-V_2$ so as to substract the bias setting voltage $+V_1$ from the superimposed signal $S_2$, thereby obtaining only the signal $S_1$. As a result, the signal $S_1$ derived from the second operational amplifier 4 is delayed at $\Delta t$ (FIG. 3(b)). Since, as described above, the reference voltage signals $V_s$ are inserted one at a time into the blanking pulses or the intervals between the adjacent frames, the time when each of the reference voltage signals $V_s$ is delivered from the second operational amplifier 4 is known. Therefore, a signal Vcount from a clock pulse generator 5 which generates clock pulses with a pulse spacing T as shown in FIG. 3(c), is used to control an analog switching element 6 connected to the output of the second operational amplifier 4 so that only the reference voltage signal Vs is applied to a capacitor 7 so as to be stored for one frame time interval. The reference voltage signal Vs stored on the capacitor 7 is applied through a third operational amplifier to the minus input of the first operational amplifier to which is applied the bias setting voltage $+V_1$. As a result, the bias voltage applied to the analog delay element is always compensated for a temperature drift resulting from the analog delay element so that the output signal from the second operational amplifier 4 does not include any temperature drift.

In summary, in the analog delay circuit in accordance with the present invention, the temperature drift resulting from the analog delay element is directly detected and the output signal from the operational amplifier 4 is compensated for the temperature drift. That is, the complete compensation for temperature drift may be attained. Furthermore, the present invention may eliminate the requirement for matching the temperature characteristics of the analog delay element with those of the temperature-sensitive element which is the temperature compensation element.

Second Embodiment, FIGS. 4 to 7 inclusive

Figure 4:
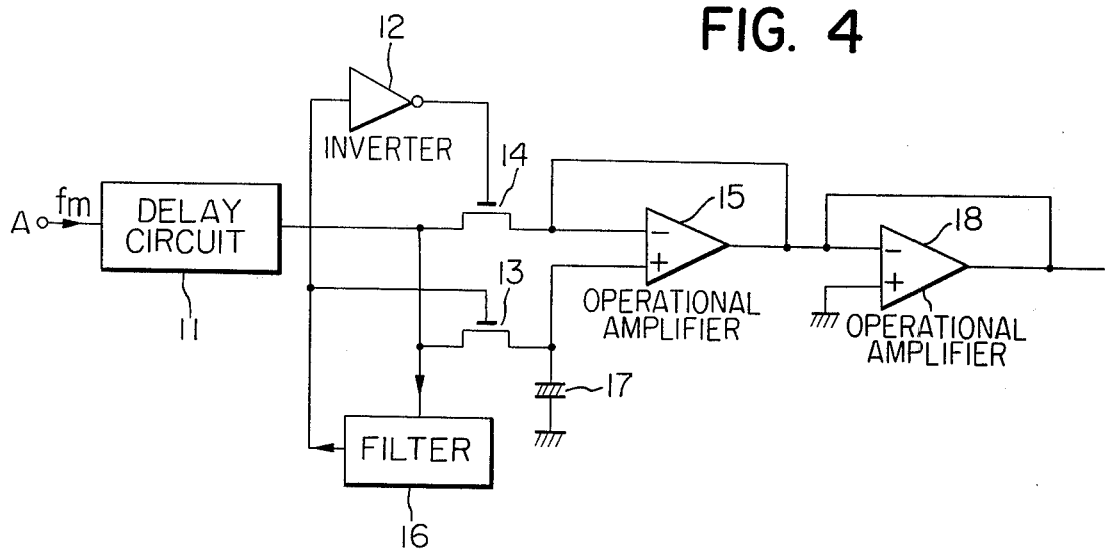
FIG. 4 is a diagram of a second embodiment of the present invention.

Referring first to FIG. 4, a second embodiment of an analog delay circuit in accordance with the present invention comprises a delay circuit 11 comprising BBD, CCD or the like, an inverter 12, analog switches 13 and 14, a first operational amplifier 15, a filter 16, a capacitor 17 and a second operational amplifier 18.

Figure 5:
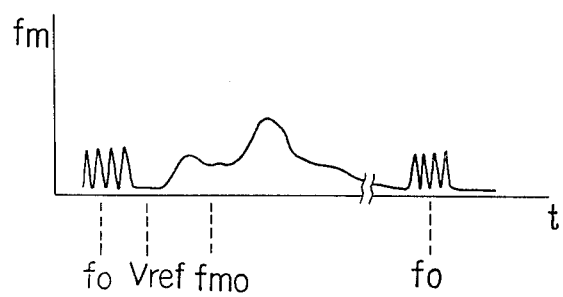
FIG. 5 shows one example of composite analog input signal waveforms used in the second embodiment.

An input signal $f_m$ applied to the input terminal A of the delay circuit 11 is a composite analog signal which is obtained by, for instance, inserting into an analog voltage signal $f_{m0}$ a reference voltage level signal Vref and a uniform voltage signal waveform $f_0$ with a predetermined frequency and a predetermined level as shown in FIG. 5. After having been delayed by a predetermined time interval by the delay circuit 11, the uniform signal waveform $f_0$ is applied to the filter 16 which passes only the uniform waveform $f_0$ so as to generate a voltage the level of which is high enough to cause the analog switch 13 to close. This voltage lasts for a time interval sufficient to permit the capacitor 17 to store the next reference voltage level signal Vref. Thus, the next reference voltage level signal Vref passes through the analog switch 13 and is applied to the capacitor 17. The voltage charged across the capacitor 17 is applied to, for instance, the plus input terminal of the first operational capacitor 15.

When the reference voltage level signal Vref has passed through the delay circuit 11, the output voltage from the filter 16 drops to zero in response to which the analog switch 13 is opened while the analog switch 14 is caused to close as the zero voltage is applied through the inverter 12 to the analog switch 14. As a result, the next analog signal $f_{m0}$ delivered from the delay circuit 11 is caused to pass through the analog switch 14 and is applied to the minus input terminal of the first operational amplifier. Thus, the output voltage from the first operational amplifier 15 becomes the difference between the analog signal $f_{m0}$ and the reference voltage level signal stored on the capacitor 17. As a consequence, even when the change in characteristic of the analog delay circuit occurs due to the temperature variations and other causes so that the difference in level between the input signal and output signal of the delay circuit results, no change in level occurs between the input signal to the delay circuit and the output signal of the operational amplifier 15 or 18.

Figure 6:
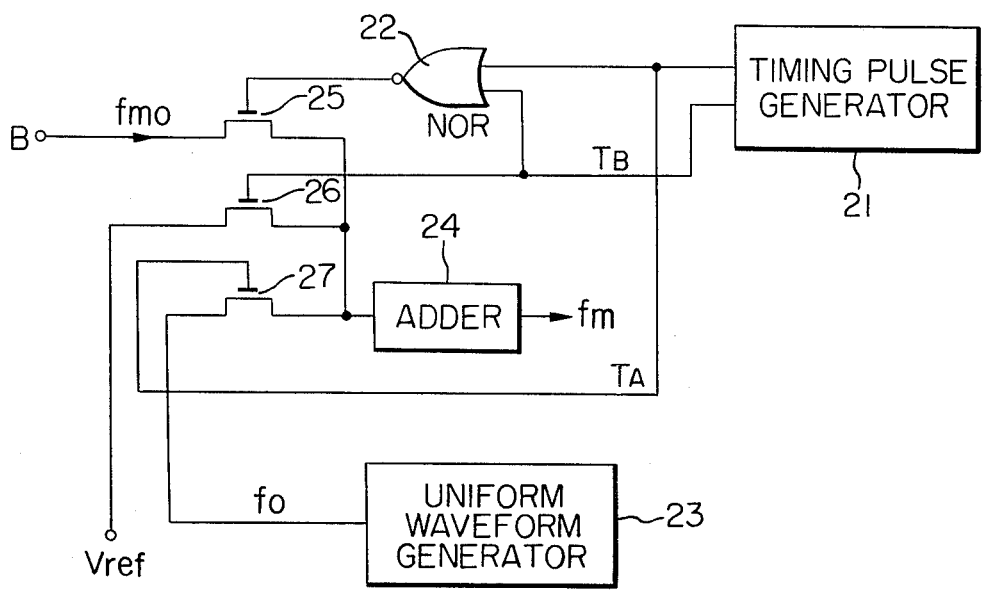
FIG. 6 is a diagram of a circuit for deriving the composite signal shown in FIG. 5.
Figure 7:
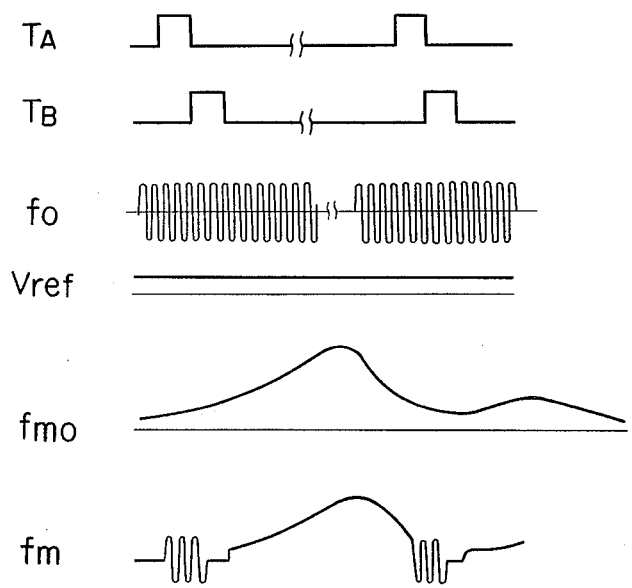
FIG. 7 shows signal waveforms used for the explanation of the mode of operation of the circuit shown in FIG. 6.

FIG. 6 shows the diagram of a circuit for generating the composite signal shown in FIG. 5. A timing pulse generator 21 generates first and second timing pulses (See FIG. 7) $T_A$ and $T_B$ with a pulse spacing shorter than that of the analog signal $f_{m0}$. When neither of the first and second timing pulses $T_{A L \ and \ TB}$ are present; that is, when a first analog switch 25 is opened in response to the output signal from a NOR gate 22, the analog signal $f_{m0}$ applied to an input terminal B passes through the first analog switch 25 and is applied to an analog adder 24. The first and second timing pulses are applied to a third analog switch 27 and a second analog switch 26, respectively, and the reference voltage level signal is applied through the second analog switch 26 to the analog adder 24 while the uniform waveform $f_0$ is applied from a uniform waveform generator 23 through the third analog switch 27 to the adder 24. As a result, the analog adder 24 delivers the signal $f_m$ as shown in FIG. 7. (See also FIG. 5).

So far it has been described that the uniform signal waveform is inserted in order to detect the reference voltage level signal, but it is to be understood that in case of the analog signal having the reference voltage levels inserted at a predetermined timing or time interval, the detection of the reference voltage level signals may be readily made so that the insertion of the uniform signal waveform $f_0$ may be eliminated.

What is claimed is:

1. An analog signal delay circuit having means for compensating D.C. drift, comprising:
   an input DC amplifier having input terminal means and an output terminal;
   analog delay circuit means having (i) an input terminal coupled to said input DC amplifier output terminal, and (ii) an output terminal;
   an output DC amplifier having input terminal means coupled to the output terminal of said analog delay circuit means and an output terminal;
   first switching means for (i) disconnecting an analog input signal from the input terminal means of said input DC amplifier during recurrent blanking intervals, and for (ii) connecting a DC reference signal to said input terminal means of said input DC amplifier only during said blanking intervals;
   means for storing a zero offset DC drift compensation signal;
   second switching means for connecting the output terminal of said output DC amplifier to said storing means only during said blanking intervals; and
   summing means coupled between said input terminal means and said storing means for combining said zero offset DC drift compensation signal with said analog input signal.

2. The circuit according to claim 1, wherein said second switching means and said storing means comprise a sample and hold circuit.

3. An analog signal delay circuit having means for compensating D.C. drift, comprising:
   analog circuit delay means having an input terminal and an output terminal;
   means for applying to said input terminal a composite signal having (i) an analog input signal component (ii) a DC reference signal component present during the trailing portions of recurrent blanking intervals, and (iii) a trigger signal component of predetermined frequency present during leading portions of said blanking intervals;

DC operational amplifier summing means;

filter means coupled to the output terminal of said analog circuit delay means and responsive to the trigger signal component of the composite signal delayed thereby for generating a blanking interval switching signal;

means for storing a zero offset DC drift compensation signal, said storage means being connected to said summing means;

first switching means responsive to said blanking interval switching signal for connecting output terminal of said analog delay circuit means to said storage means during at least the trailing portions of said blanking intervals; and second switching means responsive to said blanking interval switching signal and operative only when said first switching means is inoperative, for connecting said output terminal of said analog delay circuit means to said summing means, so that the analog input signal component of said composite signal, delayed by said analog delay circuit means, is combined in said summing means with the zero offset DC drift compensation signal stored by said storing means.

* * * * *